(12) United States Patent
Li et al.

(10) Patent No.: US 8,717,093 B2
(45) Date of Patent: May 6, 2014

(54) SYSTEM ON CHIP POWER MANAGEMENT THROUGH PACKAGE CONFIGURATION

(75) Inventors: Xiaoming Li, Irvine, CA (US); Surinderjit S. Dhaliwal, Laguna Niguel, CA (US)

(73) Assignee: Mindspeed Technologies, Inc., Newport Beach, CA (US)

( * ) Notice: Subject to any disclaimer, the term of this patent is extended or adjusted under 35 U.S.C. 154(b) by 239 days.

(21) Appl. No.: 12/655,879

(22) Filed: Jan. 8, 2010

(65) Prior Publication Data

US 2011/0169562 A1 Jul. 14, 2011

(51) Int. Cl.
G05F 1/10 (2006.01)

(52) U.S. Cl.
USPC .................... 327/544; 327/540; 326/33

(58) Field of Classification Search
USPC .................... 327/544; 326/33, 34
See application file for complete search history.

(56) References Cited

U.S. PATENT DOCUMENTS

| | | | | |
|---|---|---|---|---|
| 5,774,736 A * | 6/1998 | Wright et al. | | 713/330 |
| 5,786,630 A * | 7/1998 | Bhansali et al. | | 257/697 |
| 5,929,687 A * | 7/1999 | Yamauchi | | 327/333 |
| 6,049,245 A * | 4/2000 | Son et al. | | 327/544 |
| 6,327,663 B2 * | 12/2001 | Isaac et al. | | 713/300 |
| 6,339,358 B1 * | 1/2002 | Horiguchi et al. | | 327/544 |
| 6,411,149 B1 * | 6/2002 | Ooishi | | 327/281 |
| 6,483,165 B2 * | 11/2002 | Ooishi et al. | | 257/499 |
| 6,556,071 B2 * | 4/2003 | Notani et al. | | 327/544 |
| 6,651,178 B1 * | 11/2003 | Voegeli et al. | | 713/300 |
| 6,836,179 B2 * | 12/2004 | Mizuno et al. | | 327/544 |
| 6,943,613 B2 * | 9/2005 | Miyazaki et al. | | 327/534 |
| 7,142,009 B1 * | 11/2006 | Watt et al. | | 326/38 |
| 7,248,522 B2 * | 7/2007 | Hardee | | 365/205 |
| 7,411,283 B2 * | 8/2008 | Hockanson et al. | | 257/678 |
| 7,417,878 B2 * | 8/2008 | Tsukamoto et al. | | 363/49 |
| 7,589,584 B1 * | 9/2009 | Bui | | 327/538 |
| 7,598,726 B1 * | 10/2009 | Tabatabaei | | 324/756.07 |
| 7,622,820 B1 * | 11/2009 | Prodic et al. | | 307/31 |
| 7,659,773 B2 * | 2/2010 | Choi et al. | | 327/544 |
| 7,676,693 B2 * | 3/2010 | Otsuka et al. | | 714/23 |
| 7,692,941 B2 * | 4/2010 | Chu et al. | | 365/49.1 |
| 7,706,771 B2 * | 4/2010 | Rofougaran | | 455/343.1 |
| 7,724,078 B2 * | 5/2010 | Kurd et al. | | 327/544 |
| 7,737,770 B2 * | 6/2010 | Kuhn et al. | | 327/544 |
| 7,760,009 B2 * | 7/2010 | Yang et al. | | 327/534 |
| 7,773,390 B2 * | 8/2010 | Weir et al. | | 361/794 |
| 7,791,406 B1 * | 9/2010 | Wang et al. | | 327/544 |
| 7,834,684 B2 * | 11/2010 | Fallah et al. | | 327/544 |
| 7,856,562 B2 * | 12/2010 | Branover et al. | | 713/300 |
| 7,882,376 B2 * | 2/2011 | Ozawa | | 713/310 |
| 7,893,674 B2 * | 2/2011 | Mok et al. | | 323/283 |
| 7,960,842 B2 * | 6/2011 | Lee et al. | | 257/777 |
| 7,999,607 B2 * | 8/2011 | Kuhn et al. | | 327/544 |
| 8,050,129 B2 * | 11/2011 | Liu et al. | | 365/225.7 |

(Continued)

Primary Examiner — Thomas J Hiltunen
(74) Attorney, Agent, or Firm — Farjami & Farjami LLP

(57) ABSTRACT

There is provided a semiconductor package configured for externally controlled power management. Instead of integrating voltage regulation on-chip as done conventionally, power regulation is moved externally to the PCB level, providing numerous package advantages including size, simplicity, power efficiency, integration flexibility, and thermal dissipation. In particular, the use of flip-chip package configurations provides ready access to power supply bumps, which also allows the use of a universal receiving PCB and power supply through simple reconfiguring of voltage traces. As a result, flexible power management can be implemented, and portions of semiconductor packages may be managed for performance or thermal considerations, which may be of particular use for applications such as multi-core processors.

26 Claims, 3 Drawing Sheets

(56) References Cited

U.S. PATENT DOCUMENTS

| | | | |
|---|---|---|---|
| 8,124,429 B2* | 2/2012 | Norman | 438/17 |
| 8,130,009 B2* | 3/2012 | Von Kaenel | 326/16 |
| 8,269,373 B2* | 9/2012 | Gill et al. | 307/81 |
| 2005/0029648 A1* | 2/2005 | Suwa et al. | 257/690 |
| 2005/0139987 A1* | 6/2005 | Okada et al. | 257/700 |
| 2006/0065962 A1* | 3/2006 | Narendra et al. | 257/686 |
| 2006/0071242 A1* | 4/2006 | Frisina et al. | 257/220 |
| 2007/0242557 A1* | 10/2007 | Ozawa et al. | 365/233.5 |
| 2007/0300092 A1* | 12/2007 | Kurita | 713/323 |
| 2008/0001655 A1* | 1/2008 | Pham et al. | 327/544 |
| 2008/0162770 A1* | 7/2008 | Titiano et al. | 710/309 |
| 2008/0165608 A1* | 7/2008 | Choi et al. | 365/228 |
| 2008/0272829 A1* | 11/2008 | Maeda | 327/518 |
| 2008/0273391 A1* | 11/2008 | Steedman et al. | 365/185.18 |
| 2009/0016140 A1* | 1/2009 | Qureshi et al. | 365/227 |
| 2009/0072857 A1* | 3/2009 | Perisetty | 326/38 |
| 2009/0158071 A1* | 6/2009 | Ooi et al. | 713/340 |
| 2009/0244848 A1* | 10/2009 | Lim et al. | 361/709 |
| 2009/0278838 A1* | 11/2009 | Tu et al. | 345/214 |
| 2010/0109764 A1* | 5/2010 | Dathe et al. | 327/544 |
| 2010/0165585 A1* | 7/2010 | Lin et al. | 361/748 |
| 2010/0194470 A1* | 8/2010 | Monchiero et al. | 327/566 |
| 2011/0111705 A1* | 5/2011 | Chua-Eoan et al. | 455/73 |
| 2011/0302346 A1* | 12/2011 | Vahdat et al. | 710/301 |

\* cited by examiner

Fig. 2A
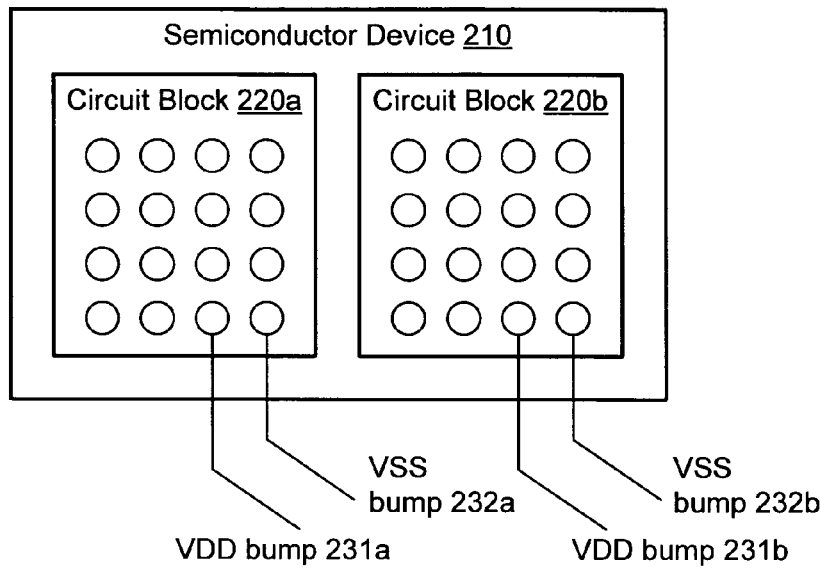
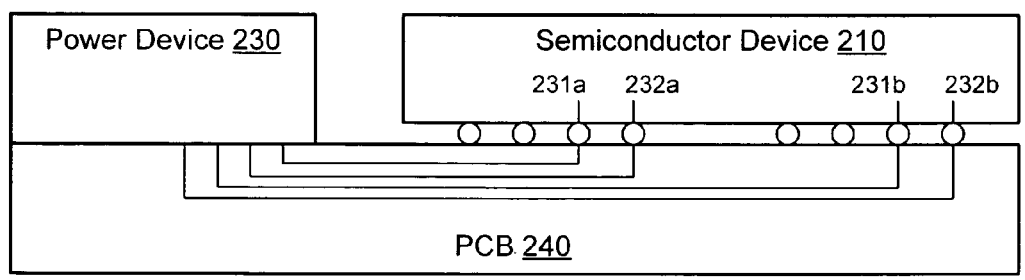
Fig. 2B

US 8,717,093 B2

SYSTEM ON CHIP POWER MANAGEMENT THROUGH PACKAGE CONFIGURATION

BACKGROUND OF THE INVENTION

1. Field of the Invention

The present invention relates generally to semiconductor packages, and more specifically to power management of semiconductor packages.

2. Background Art

Today, system-on-chip (SOC) process geometries are shrinking further into deep sub-micron regions to provide greater logic capacity for higher performance. However, these high-performance SOCs also bring corresponding demands for power consumption. In order to adequately meet these power demands, increasingly costly package designs and cooling configurations have been developed.

Efficient SOC designs in a compact form factor is highly desirable, particularly for heavily loaded data center applications where many SOCs may run in parallel, or in mobile battery-powered applications where power consumption and physical footprint must be carefully optimized. Reduction of fabrication costs and increases in yield through simplified package design may also comprise important considerations.

In particular, it is desirable to be able to turn off unused logic blocks, such as processor cores, to reduce power consumption and thermal dissipation demands. Conventionally, this has been done by using on-chip power transistors to switch power, or on-chip regulators for both switching and voltage adjustments. However, efficiency demands often require a large portion of the die to be dedicated to power devices, and power leakage remains an issue even in off-states. Thus, the addition of these power elements to a package lowers efficiency and increases cost, complexity, and form factor.

Accordingly, there is a need in the art for a package configuration that can effectively address the aforementioned difficulty of supplying power for high performance SOCs in a simple, efficient, cost effective, and space saving manner.

SUMMARY OF THE INVENTION

There is provided a semiconductor package configured for externally controlled power management, substantially as shown in and/or described in connection with at least one of the figures, as set forth more completely in the claims.

BRIEF DESCRIPTION OF THE DRAWINGS

The features and advantages of the present invention will become more readily apparent to those ordinarily skilled in the art after reviewing the following detailed description and accompanying drawings, wherein:

FIG. 2A shows a top plan view of an exemplary semiconductor package configured for externally controlled power management, according to one embodiment of the present invention;

FIG. 2B shows a cross sectional view of an exemplary semiconductor package configured for externally controlled power management, according to one embodiment of the present invention.

DETAILED DESCRIPTION OF THE INVENTION

Figure 1:
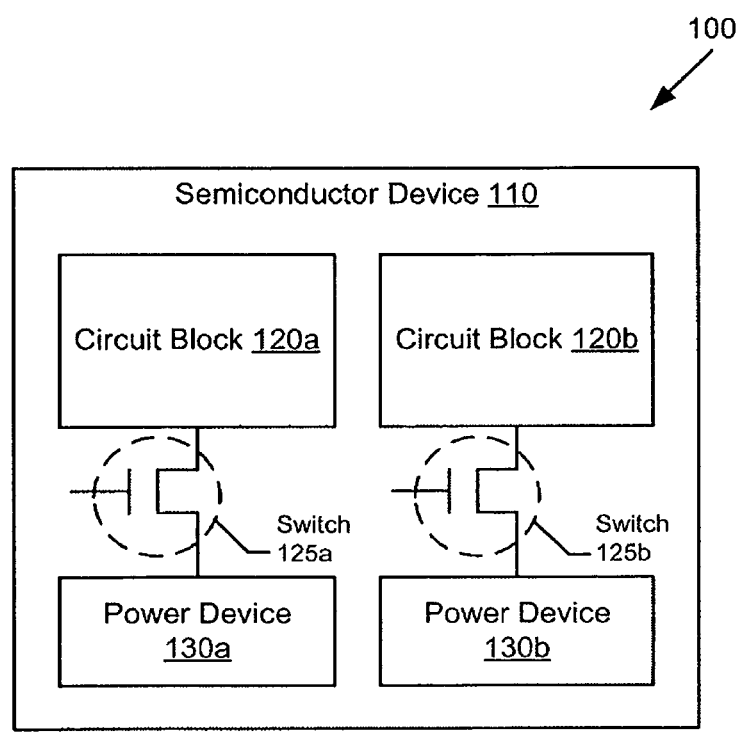
FIG. 1 shows a diagram of an exemplary semiconductor package configured for conventional on-die power management.

Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art. The drawings in the present application and their accompanying detailed description are directed to merely example embodiments of the invention. To maintain brevity, other embodiments of the invention to which use the principles of the present invention are not specifically described in the present application and are not specifically illustrated by the present drawings. It should be borne in mind that, unless noted otherwise, like or corresponding elements among the figures may be indicated by like or corresponding reference numerals.

FIG. 1 shows a diagram of an exemplary semiconductor package configured for conventional on-die power management. Diagram 100 of FIG. 1 includes semiconductor device 110, which includes circuit blocks 120a-120, switches 125a-125b, and power devices 130a-130b. Circuit blocks 120a-120b may comprise, for example, processing cores of a multi-core processor. During idle periods when there is only light load remaining in a processing workload queue, it may be desirable to turn off voltage to one or more cores. Thus, power devices 130a-130b may utilize switches 125a-125b to control on-chip voltage for circuit blocks 120a-120b. Alternatively, it may be desirable to adjust voltage through the use of voltage regulators. For example, to optimize performance for single-core processes, voltage may be increased for a single circuit block. To optimize for power savings, voltage may be decreased for one or more circuit blocks. These voltage adjustment preferences may for example be encapsulated in a power management policy embedded in the package or provided externally through software control. For example, a power management policy may be based on thermal management using internal thermal sensors to determine an appropriate voltage and operating frequency.

However, as discussed above, the use of a conventional on-die power supply as shown in FIG. 1 has several disadvantages. The area of semiconductor device 110 must be increased to accommodate switches 125a-125b and power devices 130a-130b, resulting in a larger form factor and reduced yields. Even if switches 125a-125b are opened to turn off power to circuit blocks, power leakage still occurs, resulting in lower power efficiency. The additional complexity of integrating on-chip power regulation for SOC packages results in increased design, fabrication, and testing costs.

Thus, moving to FIG. 2A, FIG. 2A shows a top plan view of an exemplary semiconductor package configured for externally controlled power management, according to one embodiment of the present invention. Diagram 200 of FIG. 2A includes semiconductor device 210. Semiconductor device 210 is configured as a flip-chip, with circuit blocks 220a-220b each including a four by four grid of solder bumps. A four by four grid is shown for simplicity, and alternative embodiments may include different arrangements of solder bumps, including greater or fewer bumps. As shown in diagram 200, a pair of power and ground bumps are indicated by VDD bumps 231a-213b and VSS bumps 232a-232b. When connected to an external voltage supply, these power bumps may provide operating power for each respective circuit block. For simplicity, each circuit block only has a single pair of power bumps indicated, but alternative embodiments may include several solder bumps reserved for receiving power.

Moving to FIG. 2B, FIG. 2B shows a cross sectional view of an exemplary semiconductor package configured for externally controlled power management, according to one embodiment of the present invention. Semiconductor device 210 is flipped and soldered to matching pads on PCB 240. In addition, power device 230, which may comprise a voltage regulated switching power supply, is integrated onto PCB 240. PCB 240 may also include traces to connect VDD bumps 231*a*-231*b* and VSS bumps 232*a*-232*b* to power device 230.

In this manner, power device 230 can directly control the supply voltage to semiconductor device 210. Thus, circuit block power management can be easily implemented by increasing, decreasing, or cutting off voltage to corresponding power bumps on semiconductor device 210. Moreover, power device 230 can flexibly adapt to different flip-chip solder bump configurations of semiconductor device 210 by simply reconfiguring the traces used for voltage management. In this manner, a common universal PCB and power supply configuration can be used for a wide variety of applications. Additionally, since power regulation functions are consolidated to the board-mounted power device 230 rather than on-chip, the disadvantages of on-chip power regulation discussed above in conjunction with FIG. 1 are avoided. In particular, the inefficient voltage leakage resulting from on-chip power circuitry can be greatly reduced or eliminated. The physical separation of power device 230 from semiconductor device 210 also spreads out the generation of heat, allowing for more efficient thermal dissipation and simplified cooling solutions. Thus, compared to conventional semiconductor package designs using on-chip power management, the semiconductor package of the present invention is reduced in size, complexity, and cost with increased efficiency and flexibility for PCB integration.

Figure 3:
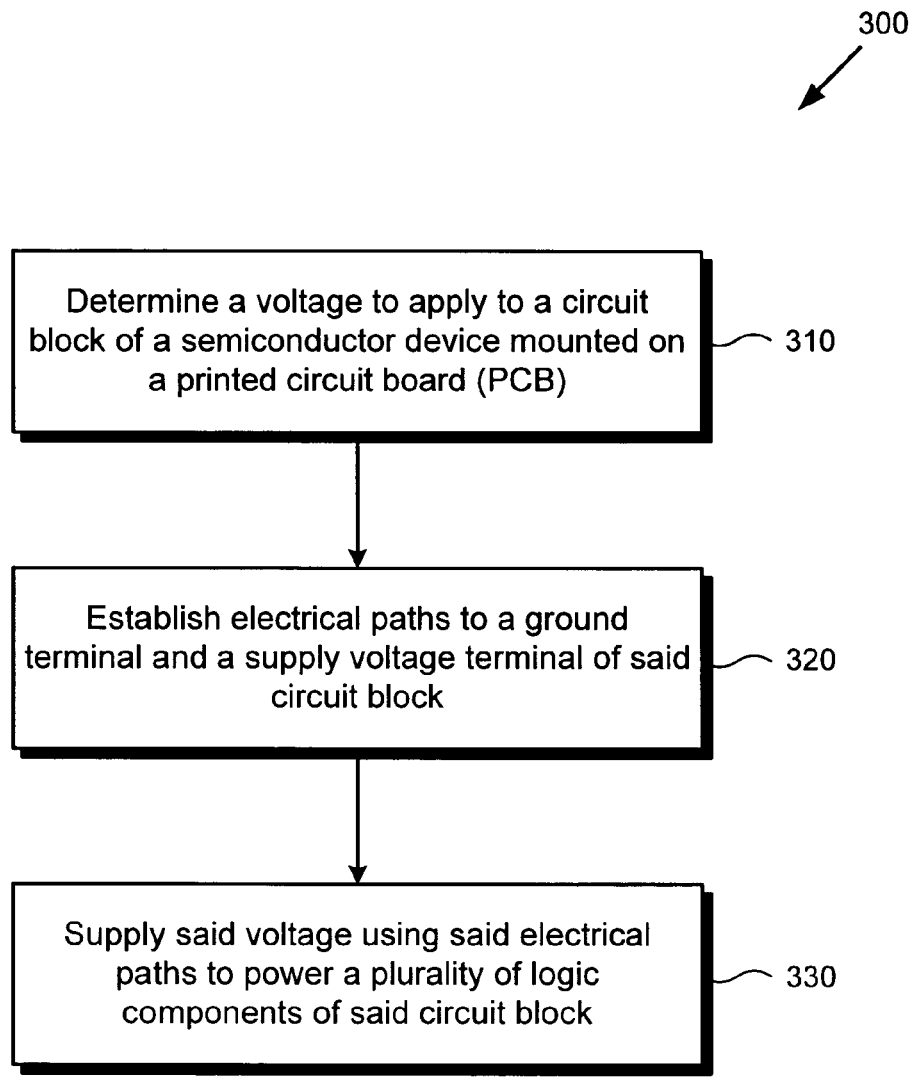
FIG. 3 is a flowchart presenting a method for a power supply of a printed circuit board (PCB) to provide power management for a semiconductor device mounted on said PCB, according to one embodiment of the present invention.

FIG. 3 is a flowchart presenting a method for a power supply of a printed circuit board (PCB) to provide power management for a semiconductor device mounted on said PCB, according to one embodiment of the present invention. Certain details and features have been left out of flowchart 300 of FIG. 3 that are apparent to a person of ordinary skill in the art. For example, a step may consist of one or more sub-steps or may involve specialized equipment, as known in the art. While steps 310 through 330 shown in flowchart 300 are sufficient to describe one embodiment of the present invention, other embodiments of the invention may utilize steps different from those shown in flowchart 300.

Referring to step 310 of flowchart 300 in FIG. 3 and diagram 200 of FIGS. 2A and 2B, step 310 of flowchart 300 comprises power device 230 determining a voltage to apply to circuit block 220*a* of semiconductor device 210 mounted on PCB 240. As previously described, voltage may be determined based on power management policy, processing workload, or other factors. Voltage may also be set to zero to completely turn off particular unneeded circuit blocks, reducing power consumption.

Referring to step 320 of flowchart 300 in FIG. 3 and diagram 200 of FIGS. 2A and 2B, step 320 of flowchart 300 comprises power device 230 establishing electrical paths to VDD bump 231*a* and VSS bump 232*a* of circuit block 220*a*. As shown in FIG. 2B, traces are available on PCB 240 to connect power device 230 to the desired bumps on semiconductor device 210. In addition, as previously described, power device 230 may be able to flexibly adapt to different flip-chip solder bump configurations of semiconductor device 210 by simply reconfiguring the traces used. In this manner, semiconductor devices with different solder bump configurations can be supported on a single universal PCB and power supply platform.

Referring to step 330 of flowchart 300 in FIG. 3 and diagram 200 of FIGS. 2A and 2B, step 320 of flowchart 300 comprises power device 230 supplying the voltage determined in step 310 using the electrical paths established in step 320 to power a plurality of logic components of circuit block 220*a*. As previously discussed, circuit block 220*a* may, for example, comprise a core of a multi-core processor. Thus, step 330 may provide power for the core to perform data processing, calculations, or other logic duties.

Steps 310-330 may also be repeated to adjust other circuit blocks of semiconductor device 210, such as circuit block 220*b*. In this manner, finely tuned semiconductor package power management is possible without requiring on-die power management devices, allowing the use of simplified semiconductor packages with reduced size and cost but with increased efficiency and flexibility for PCB integration.

From the above description of the embodiments of the present invention, it is manifest that various techniques can be used for implementing the concepts of the present invention without departing from its scope. Moreover, while the present invention has been described with specific reference to certain embodiments, a person of ordinary skill in the art would recognize that changes can be made in form and detail without departing from the spirit and the scope of the invention. It should also be understood that the invention is not limited to the particular embodiments described herein, but is capable of many rearrangements, modifications, and substitutions without departing from the scope of the invention.

What is claimed is:

1. A semiconductor package for use on a circuit board having a power device, the semiconductor package comprising:
   a first circuit block disposed on a top surface of said circuit board, said first circuit block having:
      a plurality of first logic components;
      a first supply voltage terminal for said plurality of first logic components, said first supply voltage terminal connectable to a first adjustable voltage via a first contact of said first circuit block with said circuit board connected to a first power line of said circuit board connected to a first contact of said power device with said circuit board; and
      a first ground terminal for said plurality of first logic components, said first ground terminal connectable to a ground via a second contact of said first circuit block with said circuit board connected to said power device;
   a second circuit block having:
      a plurality of second logic components;
      a second supply voltage terminal for said plurality of second logic components, said second supply voltage terminal connectable to a second adjustable voltage via a first contact of said second circuit block with said circuit board connected to a second power line of said circuit board connected to a second contact of said power device with said circuit board; and
      a second ground terminal for said plurality of second logic components, said second ground terminal connectable to a ground via a second contact of said second circuit block with said circuit board connected to said power device; and wherein said power device is integrated onto said top surface of said circuit board.

2. The semiconductor package of claim 1 further configured as a flip-chip package.

3. The semiconductor package of claim 2, wherein each of said first supply voltage terminal, said second supply voltage terminal, said first ground terminal and said second ground terminal comprises a solder bump.

4. The semiconductor package of claim 1, wherein increasing said first adjustable voltage of said first circuit block increases a processing speed of said plurality of first logic components.

5. The semiconductor package of claim 1, wherein said first supply voltage terminal receives said first adjustable voltage by a voltage regulation component of said external power supply.

6. The semiconductor package of claim 1, wherein said first supply voltage terminal receives said first adjustable voltage as a zero voltage from said external power supply.

7. The semiconductor package of claim 1 further configured as' a multi-core processor, wherein said plurality of supply logic components comprises a core of said multi-core processor.

8. The semiconductor package of claim 1, wherein said first supply voltage terminal receives said first adjustable voltage dependent on a processing workload queue.

9. The semiconductor package of claim 1, wherein said first supply voltage terminal receives said first adjustable voltage dependent on a power management policy.

10. The semiconductor package of claim 1, wherein said power device directly controls a supply voltage to said first circuit block and said second circuit block.

11. The semiconductor package of claim 1, wherein said first supply voltage terminal, said second supply voltage terminal, said first ground terminal and said second ground terminal comprise a grid of solder bumps.

12. The semiconductor package of claim 1, wherein said printed circuit board comprises a plurality of traces to connect said first supply voltage terminal, said second supply voltage terminal, said first ground terminal and said second ground terminal to said power device.

13. A method of providing power to a semiconductor package on a circuit board having a power device, the semiconductor package including a first circuit block disposed on a top surface of said circuit board and having a plurality of first logic components, a first supply voltage terminal for said plurality of first logic components, said first supply voltage terminal connected to a first adjustable voltage via a first contact of said first circuit block with said circuit board connected to a first power line of said circuit board connected to a first contact of said power device with said circuit board, and a first ground terminal for said plurality of first logic components, said first ground terminal connected to a ground via a second contact of said first circuit block with said circuit board connected to said power device, the semiconductor package further including a second circuit block having a plurality of second logic components, a second supply voltage terminal for said plurality of second logic components, said second supply voltage terminal connected to a second adjustable voltage via a first contact of said second circuit block with said circuit board connected to a second power line of said circuit board connected to a second contact of said power device with said circuit board, and a second ground terminal for said plurality of second logic components, said second ground terminal connected to a ground via a second contact of said second circuit block with said circuit board connected to said power device, wherein said power device is integrated onto said top surface of said circuit board, the method comprising:
providing said first adjustable voltage to said first contact of said first circuit block via said first power line of said circuit board connected to said first contact of said power device;
providing said ground to said second contact of said first circuit block;
providing said second adjustable voltage to said first contact of said second circuit block via said second power line of said circuit board connected to said second contact of said power device; and
providing said ground to said second contact of said second circuit block.

14. The method of claim 13, wherein the semiconductor package is a flip-chip package.

15. The method of claim 14, wherein each of said first supply voltage terminal, said second supply voltage terminal, said first ground terminal and said second ground terminal comprises a solder bump.

16. The method of claim 13, wherein increasing said first adjustable voltage of first circuit block increases a processing speed of said plurality of first logic components.

17. The method of claim 13, wherein said first supply voltage terminal receives said first adjustable voltage by a voltage regulation component of said external power supply.

18. The method of claim 13, wherein said first supply voltage terminal receives said first adjustable voltage as a zero voltage from said external power supply.

19. The method of claim 13, wherein the semiconductor package is a multi-core processor, wherein said plurality of supply logic components comprises a core of said multi-core processor.

20. The method of claim 13, wherein said first supply voltage terminal receives said first adjustable voltage dependent on a processing workload queue.

21. The method of claim 13, wherein said first supply voltage terminal receives said first adjustable voltage dependent on a power management policy.

22. The semiconductor package of claim 12, wherein said plurality of traces are reconfigurable for any configuration of said first supply voltage terminal, said second supply voltage terminal, said first ground terminal and said second ground terminal.

23. The method of claim 13, wherein said power device directly controls a supply voltage to said first circuit block and said second circuit block.

24. The method of claim 13, wherein said first supply voltage terminal, said second supply voltage terminal, said first ground terminal and said second ground terminal comprise a grid of solder bumps.

25. The method of claim 13, wherein said printed circuit board comprises a plurality of traces to connect said first supply voltage terminal, said second supply voltage terminal, said first ground terminal and said second ground terminal to said power device.

26. The method of claim 25, wherein said plurality of traces are reconfigurable for any configuration of said first supply voltage terminal, said second supply voltage terminal, said first ground terminal and said second ground terminal.

* * * * *